United States Patent
Williams et al.

(10) Patent No.: US 7,366,825 B2
(45) Date of Patent: Apr. 29, 2008

(54) NAND FLASH MEMORY MANAGEMENT

(75) Inventors: Gregory G. Williams, Menlo Park, CA (US); Harjit Singh, Redmond, WA (US); Michael G. Love, San Francisco, CA (US); Stephen Z. Au, San Jose, CA (US)

(73) Assignee: Microsoft Corporation, Redmond, WA (US)

( * ) Notice: Subject to any disclaimer, the term of this patent is extended or adjusted under 35 U.S.C. 154(b) by 260 days.

(21) Appl. No.: 11/115,004

(22) Filed: Apr. 26, 2005

(65) Prior Publication Data

US 2006/0239075 A1  Oct. 26, 2006

(51) Int. Cl.
*G06F 12/00* (2006.01)
(52) U.S. Cl. .................. 711/103; 711/156; 711/170; 714/3
(58) Field of Classification Search ............ 711/103, 711/156, 170; 714/3
See application file for complete search history.

(56) References Cited

U.S. PATENT DOCUMENTS

| | | | | |
|---|---|---|---|---|
| 5,933,852 A | * | 8/1999 | Jeddeloh ................... | 711/153 |
| 6,000,006 A | * | 12/1999 | Bruce et al. .............. | 711/103 |
| 2004/0133734 A1 | * | 7/2004 | Jordan et al. ............. | 711/103 |

OTHER PUBLICATIONS

Application Note for NAND Flash Memory (Revision 2.0), Memory Products & Technology Division, Dec. 28, 1999, Product Planning & Application Engineering, The Leader in Memory Technology, Samsung Electronics, pp. 1-30.

Flash Memory, 64M ×8 Bit, 32M ×16 Bit NAND Flash Memory, Samsung Electronics, pp. 1-39.

NAND Flash ECC Algorithm (Error Checking & Correction), Product Planning & Application Engineering Team, Jun. 2004, Memory Division, Samsung Electronics Co., Ltd, 8 pages.

* cited by examiner

*Primary Examiner*—Stephen C. Elmore
(74) *Attorney, Agent, or Firm*—Woodcock Washburn LLP

(57) ABSTRACT

A memory controller is utilized to overcome NAND flash memory's propensity for comprising bad blocks of memory. The memory controller utilizes minimal hardware and is essentially transparent to a device requesting access to the NAND memory. A NAND flash memory device is configured to comprise a set of main blocks of memory and a set of auxiliary blocks of memory. Each block is divided into pages of memory and each page includes metadata. The metadata includes a block status indicator, indicating whether a block is good or bad. When receiving a request to access a page in the NAND flash memory, if the block in which the page resides is good, that block is accessed. If the block is bad, auxiliary memory is searched until a block containing the address of the bad block in its metadata is found. The found block is accessed in lieu of the bad block.

20 Claims, 10 Drawing Sheets

NAND FLASH MEMORY MANAGEMENT

FIELD OF THE INVENTION

The present invention relates generally to electronics and specifically to memory management. The invention relates even more specifically to memory management of NAND flash memory devices.

BACKGROUND OF THE INVENTION

Flash memory is a form of electrically erasable programmable read only memory (EEPROM). Unlike typical EEPROM, which is erasable one byte at a time, flash memory is capable of being erased one block at a time. Block sizes vary for various flash memory devices. Flash memory devices are typically small, light weight, and consume low amounts of power. Thus, flash memory is appropriate for devices such as mobile devices, battery powered devices, devices desiring low power consumption, and/or small devices, for example. Two popular types of flash memory are NOR flash memory and NAND flash memory. As the names suggest, NOR flash memory utilizes circuitry comprising NOR gates and NAND flash memory utilizes circuitry comprising NAND gates.

NAND flash memory has several advantages over NOR flash memory. NOR flash memory is less dense than NAND flash memory. That is, more bytes of memory can be incorporated into a volume of NAND flash memory than can be incorporated into the same volume of NOR flash memory. The access times associated with NOR flash memory are typically slower than access times associated with NAND flash memory. Further, development costs associated with NAND flash memory are typically less than development costs associated with NOR flash memory. Thus, it would appear that NAND flash memory would be the obvious choice for any application.

However, NAND flash memory has a disadvantage which, to date, has limited its use. NAND flash memory is prone to developing bad blocks of memory. Two primary occurrences of this are often observed. One observance is that blocks within a NAND flash memory device are bad when the NAND flash memory device is delivered from the manufacturer. The other is that blocks go bad while the NAND flash memory device is being used. The latter is often due to a NAND flash memory device's fixed write/erase endurance.

There is a desire to utilize NAND flash memory while mitigating the above detrimental effects.

SUMMARY OF THE INVENTION

In accordance with an exemplary embodiment of the present invention, a memory controller is utilized to overcome NAND flash memory's propensity for comprising bad blocks of memory. For each NAND flash memory device, the memory is configured to comprise a set of main blocks of memory (referred to as the main portion of memory) and a set of auxiliary blocks of memory (referred to as the auxiliary portion of memory). Each block is divided into pages of memory. Each page is divided into a payload data portion and a metadata portion. Each metadata portion comprises a block status indicator (referred to as a bad block indicator, or BBI) and a block address identifier (referred to as block ID, or BID). The BBI indicates whether the block is good or bad. If a block is bad, the memory controller maps the bad block to a corresponding good block in the auxiliary portion of memory. The address of the bad block is stored in the BID of the metadata portion of the corresponding good block in the auxiliary portion of memory. The BBI and BID are stored in the metadata portion of a predetermined page of each block. In an exemplary embodiment of the present invention, the predetermined page is the $0^{th}$ page of the block.

When a request to access a page of memory in the NAND flash memory device is received, via the memory controller, the BBI stored in the metadata portion of the $0^{th}$ page of the block in which the requested page resides, is checked. If the block is good, the requested page is accessed. If the block is bad, the memory controller accesses a corresponding block in the auxiliary portion of memory in accordance with the logical address in the metadata portion of the $0^{th}$ page of the corresponding good block in the auxiliary portion of memory. The memory controller is transparent to the requesting device. Thus, a requesting device can access (e.g., read, write, erase) a NAND flash memory device without having to account for bad blocks. The requesting device can access memory using contiguous addresses.

BRIEF DESCRIPTION OF THE DRAWINGS

The foregoing and other objects, aspects and advantages will be better understood from the following detailed description with reference to the drawings, in which.

DETAILED DESCRIPTION OF ILLUSTRATIVE EMBODIMENTS

A memory management system is described herein with application to NAND flash memory. However, it is to be understood that the application of this memory management system should not be limited thereto. This memory management system is applicable to any appropriate type of memory, such a NAND flash memory, NOR flash memory, flash memory in general, non-flash memory, or a combination thereof, for example.

Figure 1:
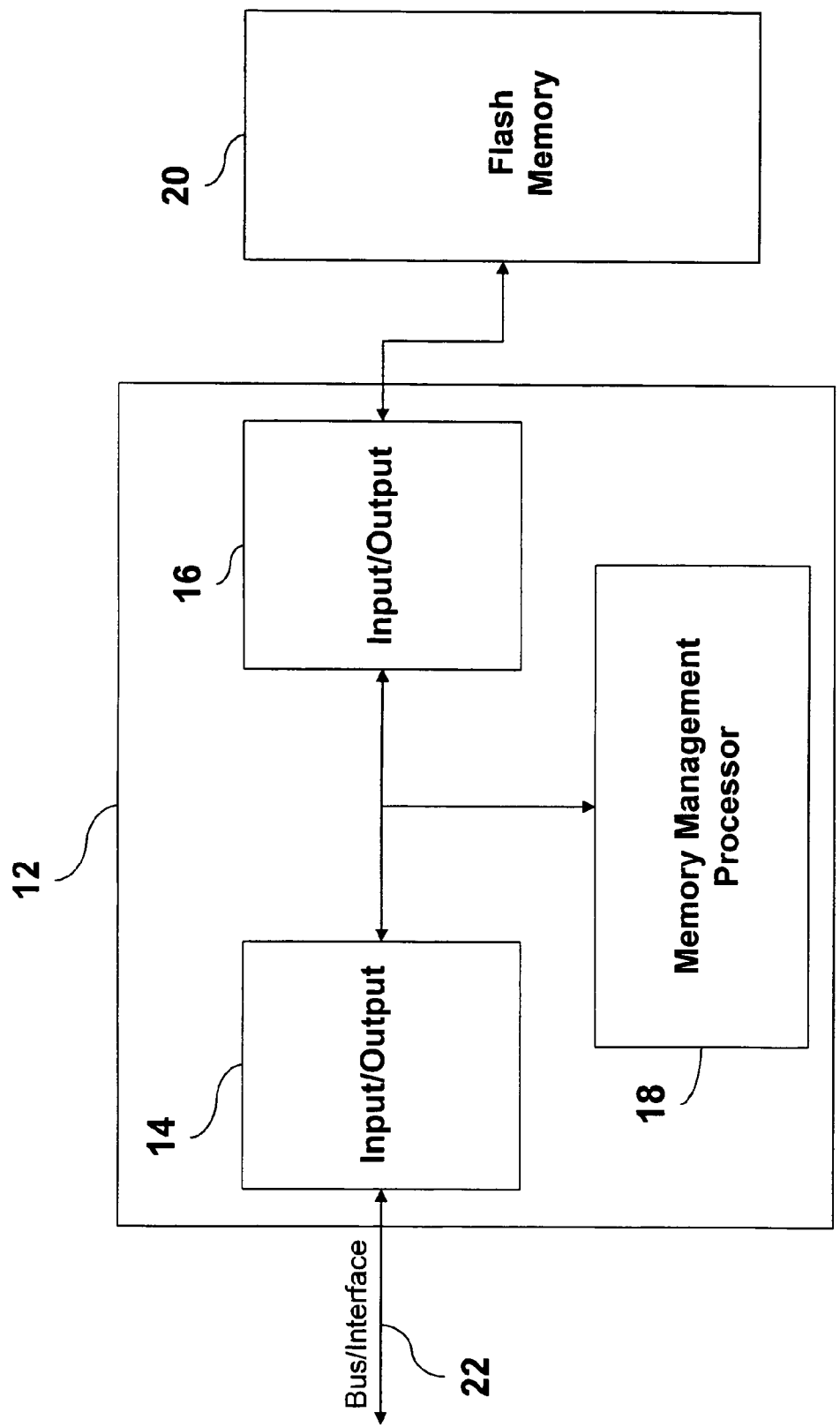
FIG. 1 is a block diagram depicting a memory management system in accordance with an exemplary embodiment of the present invention.

FIG. 1 is a diagram of a memory management system comprising memory controller 12 and NAND flash memory device 20 in accordance with an exemplary embodiment of the present invention. The memory controller 12 comprises an input/output portion 14, an input/output portion 16, and a memory management processor 18. The input/output portion 14 is coupleable to any appropriate device desiring access (accessing device not shown in FIG. 1) to the NAND flash memory 20. The accessing device is coupled to the memory controller 12 via interface 22. The interface 22 can comprise any appropriate interface, such a bus interface, for example. In an exemplary embodiment of the present invention, the memory controller 12 is transparent to the access device. Thus, the accessing device "thinks" it is interfaced directly to the NAND flash memory device 20. Accordingly, in an exemplary embodiment of the present invention, the interface 22 is similar to an interface that the accessing device would use if it were coupled to the NAND flash memory 20, without the memory controller 12 therebetween. The input/output portion 14 can comprise any appropriate hardware, software, processor, or combination thereof. The input/output portion 16 couples the memory controller 12 to the NAND flash memory device 20. The input/output portion 16 can comprise any appropriate hardware, software, processor, or combination thereof.

As described in more detail below, the memory management processor 18 manages access to memory of the NAND flash memory device 20. The term "access" as used herein comprises read, write, erase, or a combination thereof. The memory management processor 18 also maps bad blocks within the NAND flash memory device 20 to good blocks within the NAND flash memory device 20. To accomplish memory management and mapping in accordance with an exemplary embodiment of the present invention, information within the NAND flash memory device 20 is configured in accordance with a specific data structure.

Figure 2:
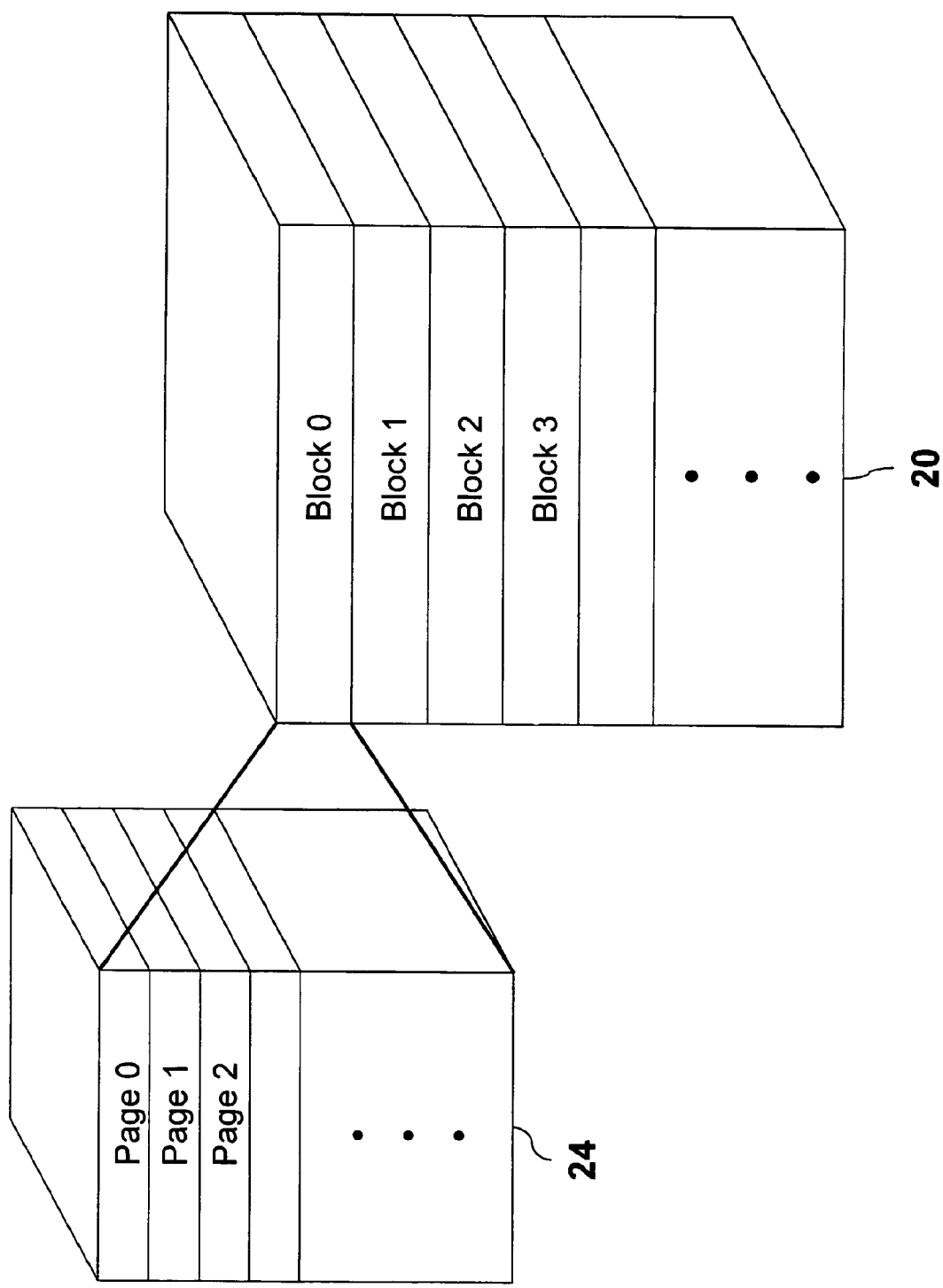
FIG. 2 is a diagram of the data structure of blocks and pages of a flash memory in accordance with an exemplary embodiment of the present invention.

FIG. 2 is a diagram of the NAND flash memory device 20 illustrating the data structure for blocks and pages, in accordance with an exemplary embodiment of the present invention. The NAND flash memory device 20 comprises a fixed number of blocks. Each block comprises a fixed number of pages as illustrated in graphic number 24. Each page comprises a fixed number of bytes. Various configurations are envisioned. For example, a NAND flash memory device can comprise 1024 blocks per device, each block can comprise 16 pages, and each page can comprise 528 bytes. This example configuration is depicted in the first row of Table 1 below. Other example configurations are shown in rows 2 through 4 of Table 1.

TABLE 1

| Row Number | Number of Blocks Per Device | Number of Pages Per Block | Number of Bytes Per Page |
|---|---|---|---|
| 1 | 1024 | 16 | 512 B + 16 B |
| 2 | 1024 | 32 | 512 B + 16 B |
| 3 | 2048 | 32 | 512 B + 16 B |
| 4 | 4096 | 32 | 512 B + 16 B |

Figure 3:
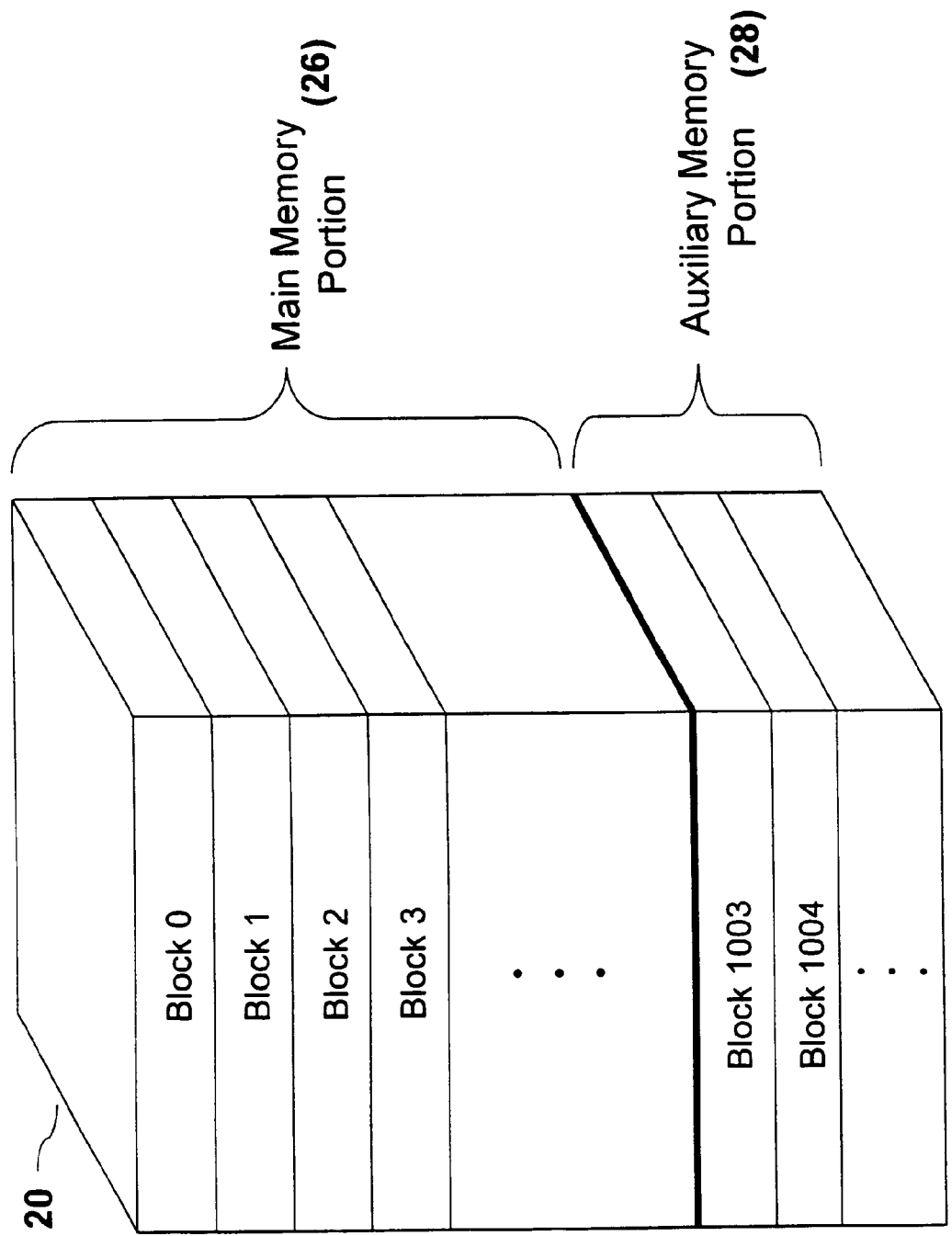
FIG. 3 is a diagram of the data structure of a flash memory comprising a main memory portion and an auxiliary memory portion in accordance with an exemplary embodiment of the present invention.

FIG. 3 is a diagram of the data structure of a flash memory comprising a main memory portion 26 and an auxiliary memory portion 28 in accordance with an exemplary of the present invention. The auxiliary memory portion 28 comprises a predetermined number of blocks of the NAND flash memory device. The main memory portion 26 comprises the remaining number of blocks of the NAND flash memory device. It is envisioned that the number of blocks in the main memory portion 26 will be greater than the number of blocks in the auxiliary memory portion. In an exemplary embodiment of the present invention, the number of blocks in the auxiliary memory portion 28 is approximately equal to 2% of the number of blocks in the main memory portion 26. As depicted in FIG. 3, the blocks of the memory portion 26 are located at the top (i.e., lowest address locations) of the NAND flash memory device 20 and the blocks of the auxiliary memory portion 28 are located at the bottom (i.e., highest address locations) of the NAND flash memory device 20. This depiction, however, is exemplary. The blocks of the main memory portion 26 and the blocks of the auxiliary memory portion 28 can be located at any appropriate address within the flash memory 20. The blocks of each memory portion can even be interspersed.

If no blocks of memory ever go bad in the NAND flash memory device, the main memory portion 26 of the NAND flash memory device would be the only portion of memory that would be accessed. However, because blocks are known to go bad in NAND flash memory devices, the blocks in auxiliary memory portion 28 are used as spare blocks. That is, the blocks in the auxiliary memory portion are set aside and accessed in place of a bad block located in the main memory portion 26. The memory controller 12 (see FIG. 1) maps bad blocks in the main memory portion 26 to corresponding blocks in the auxiliary memory portion 28. This is facilitated by information stored in a predetermined page of each block. Thus, a closer look at the data structure of a page of memory is appropriate.

Figure 4:
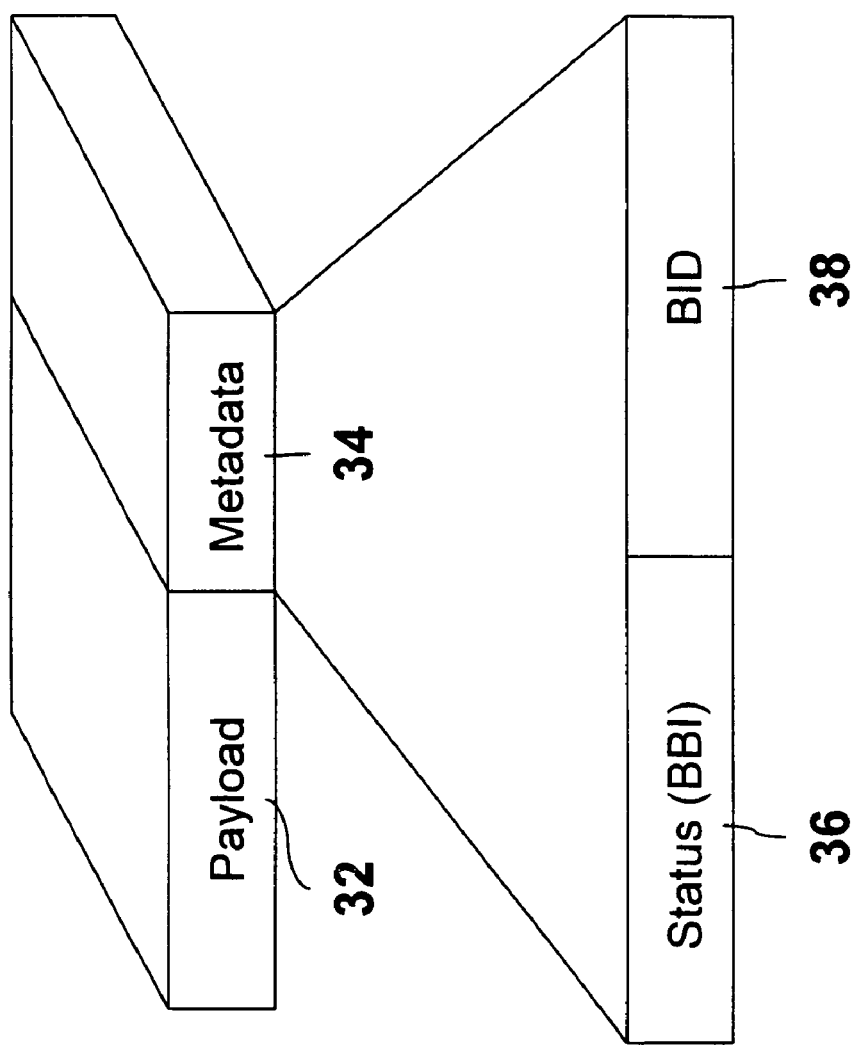
FIG. 4 is a more detailed diagram of the data structure of a page of a flash memory in accordance with an exemplary embodiment of the present invention.

FIG. 4 is a diagram of the data structure of a page of a flash memory in accordance with an exemplary embodiment of the present invention. Each page comprises a payload portion 32 and a metadata portion 34. The metadata portion 34 comprises a status indicator portion 36 and a block identifier portion 38. In an exemplary embodiment of the present invention, as indicated in Table 1 above, the payload portion 32 comprises 512 bytes and the metadata portion 34 comprises 16 bytes. The metadata portion 34 comprises a block status indicator (referred to as a bad block indicator, or BBI) 36 and a block address identifier (referred to as block ID, or BID) 38. The BBI 36 indicates whether a block in the NAND flash memory is good or bad. If a block located in the main memory portion 26 is bad, the memory controller 12 designates a corresponding good block in the auxiliary memory portion 28 to the bad block. The address of the bad block in the main memory portion 26 is stored in the BID 38 of the metadata portion 34 of the designated block located in the auxiliary memory portion 28. In an exemplary embodiment of the present invention, the BBI 36 and the BID 38 are stored in a single predetermined page of each block of the NAND memory device 20. In yet another exemplary embodiment of the present invention, the predetermined page is the $0^{th}$ page of each block. The mapping is accomplished by storing, in a predetermined page of each block, indicators of the status of each block and by storing the address of a bad block in the main memory portion 26 in a designated block in the auxiliary memory portion 28. The BID 38 also can be indicative of the state of a page.

Figure 5:
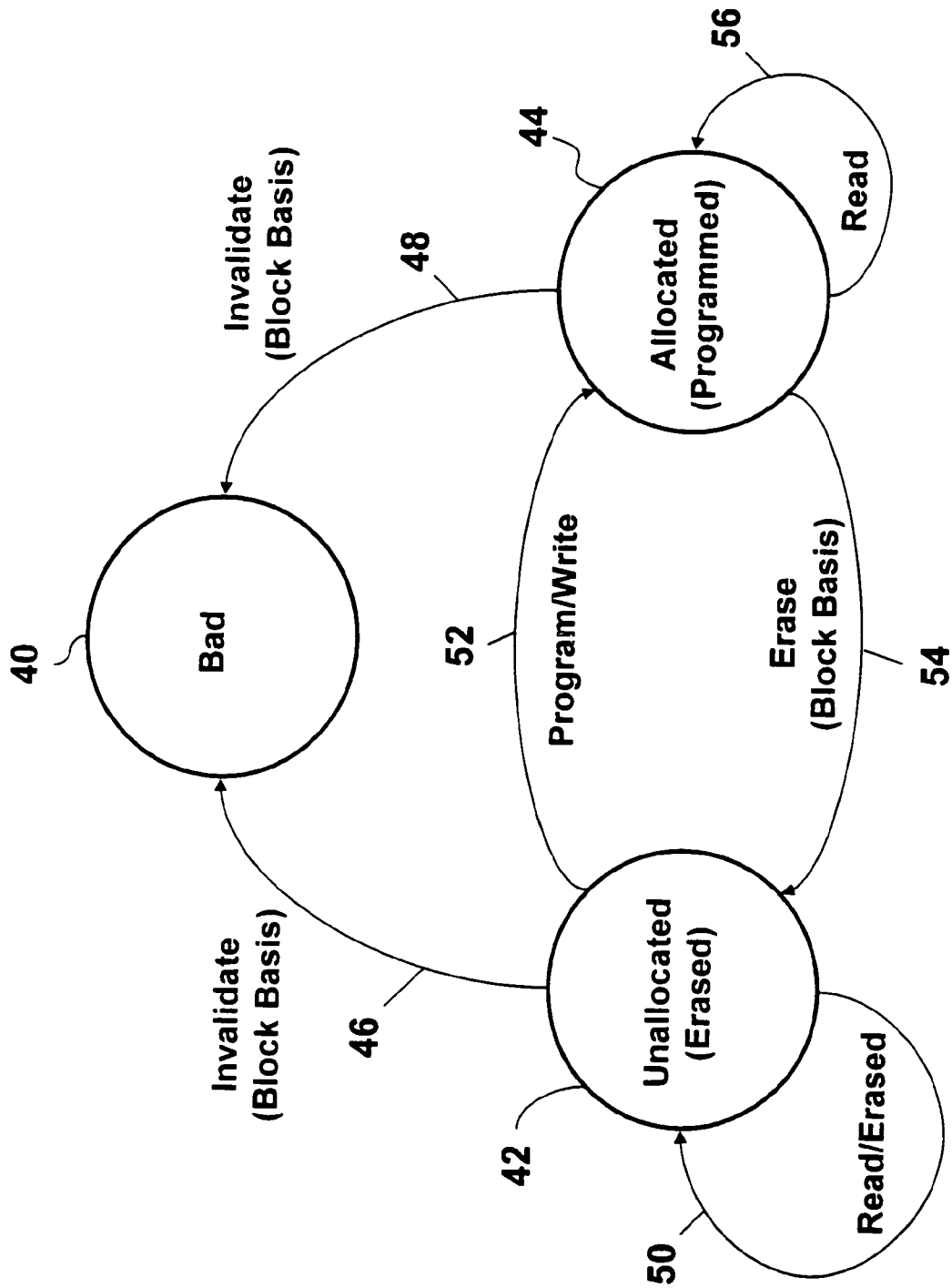
FIG. 5 is a page state diagram in accordance with an exemplary embodiment of the present invention.

FIG. 5 is a state diagram illustrating the three states of a page of NAND flash memory in accordance with an exemplary embodiment of the present invention. The circles represent page states and the arrows represent transitions between states. Flash memory cells are given a value of binary 1 ("1" state) when erased. When programmed (written to), the cells are given a value of binary 0 ("0" state).

Flash memory cells are erased before they are programmed (written to). The erase operation is performed on a block basis, however the program (write) operation is performed on a page basis. Read operations also are performed on a page basis. Accordingly, the three allowable states of a page of a NAND flash memory device are the bad state 40, the unallocated state 42, and the allocated state 44. If a page is in the unallocated state 42, it has been erased. An unallocated page can be read. When an unallocated page is read, its state does not change, as indicated by transition arrow 50. An unallocated page can be erased. When an unallocated page is erased, its state does not change, as indicated by transition 50. An unallocated page can be programmed, or written to. When an unallocated page is programmed, or, written to, its state changed from unallocated 42 to allocated 44 as indicated by transition arrow 52.

An allocated page (state 44) can be read. When an unallocated page is read, its state does not change, as indicated by transition arrow 56. An allocated page (state 44) can be erased. When an allocated page is erased, its state changes from allocated 44 to unallocated 42, as indicated by transition arrow 54. Note, that pages are erased on a per block basis. Thus, if a page is erased, all pages in the same block are erased. If a page is determined to be bad, it is invalidated, and its state transitions to bad 40. Unallocated pages (state 42) and allocated pages (state 44) can transition to a bad state 40. These transitions are indicated by transition arrow 46 for a transition from unallocated 42 to bad 40, and by transition arrow 48 for a transition from allocated 44 to bad 40. When a page is invalidated, all pages in the same block are invalidated. Thus, if a page in a block goes bad (state 40), all pages in that blocked are deemed to be bad (state 40).

A block is marked as good or bad by storing a value indicative of block status in the BBI portion 36 of the metadata portion 34 of page zero of that block (see FIG. 4). Because pages are invalidated on a block basis, the BBI also is indicative of the status of all the pages in that block as being one of good or bad.

A page is marked as unallocated or allocated by storing a value indicative of page state in the BID portion 38 of the metadata portion 34 of a page (see FIG. 4). In an exemplary embodiment of the present invention, a BID value of all binary 1s (ones) is indicative of unallocated page and a BID value of other than all binary 1s is indicative of an allocated page.

Figure 6:
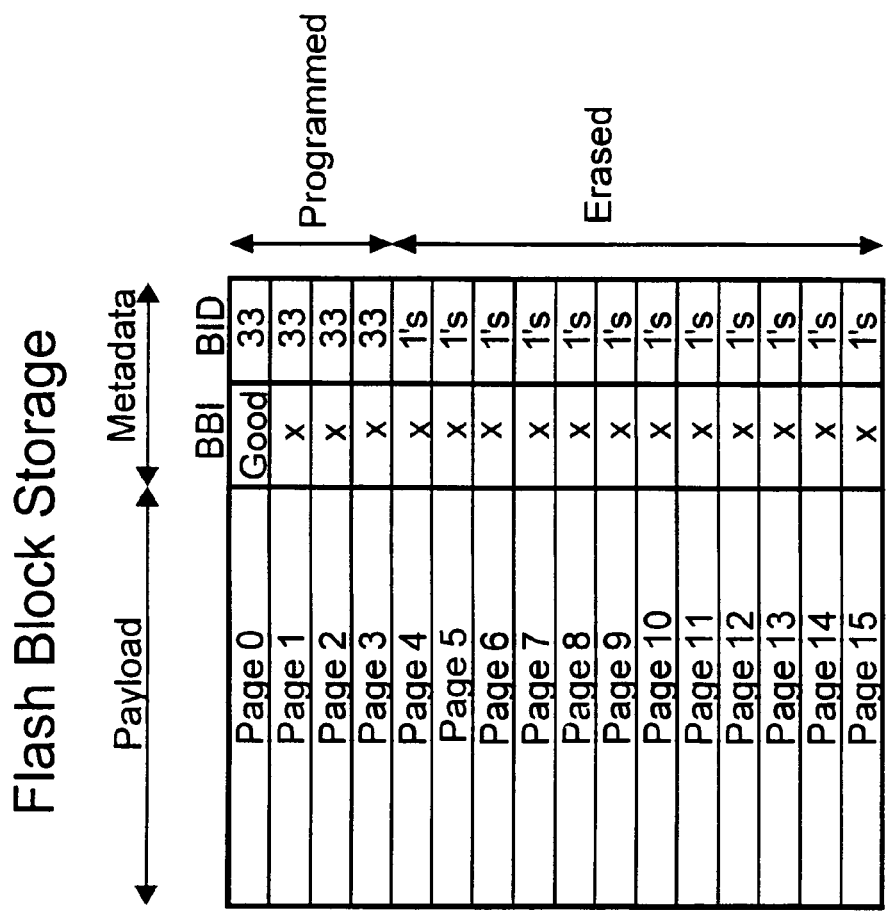
FIG. 6 is a diagram illustrating exemplary page and block status for a single block in accordance with an exemplary embodiment of the present invention.

FIG. 6 is a diagram illustrating exemplary page and block status for a single block in accordance with an exemplary embodiment of the present invention. As shown in FIG. 6, the BID portion of each of pages 0 through 3 has stored therein a value of 33. Because the value in the BID portion of metadata of pages 0 through 3 is other than all binary 1s, pages 0 through 3 are allocated. Pages 4 through 15 are unallocated because the BID value in each of these pages is all binary 1s. Page 0 of each block contains a valid BBI. Thus, for the purpose of determining the status of a block, it does not matter what the value is in the BBI portion of metadata for pages other than page 0 of each block. Accordingly, the BBI portion of metadata for pages 1 through 15 is marked as a don't care ("x"). The value of the BBI is utilized to determine if a block is bad, and thus a corresponding designated block in the auxiliary memory portion of the NAND flash memory device is to be accessed.

Figure 7:
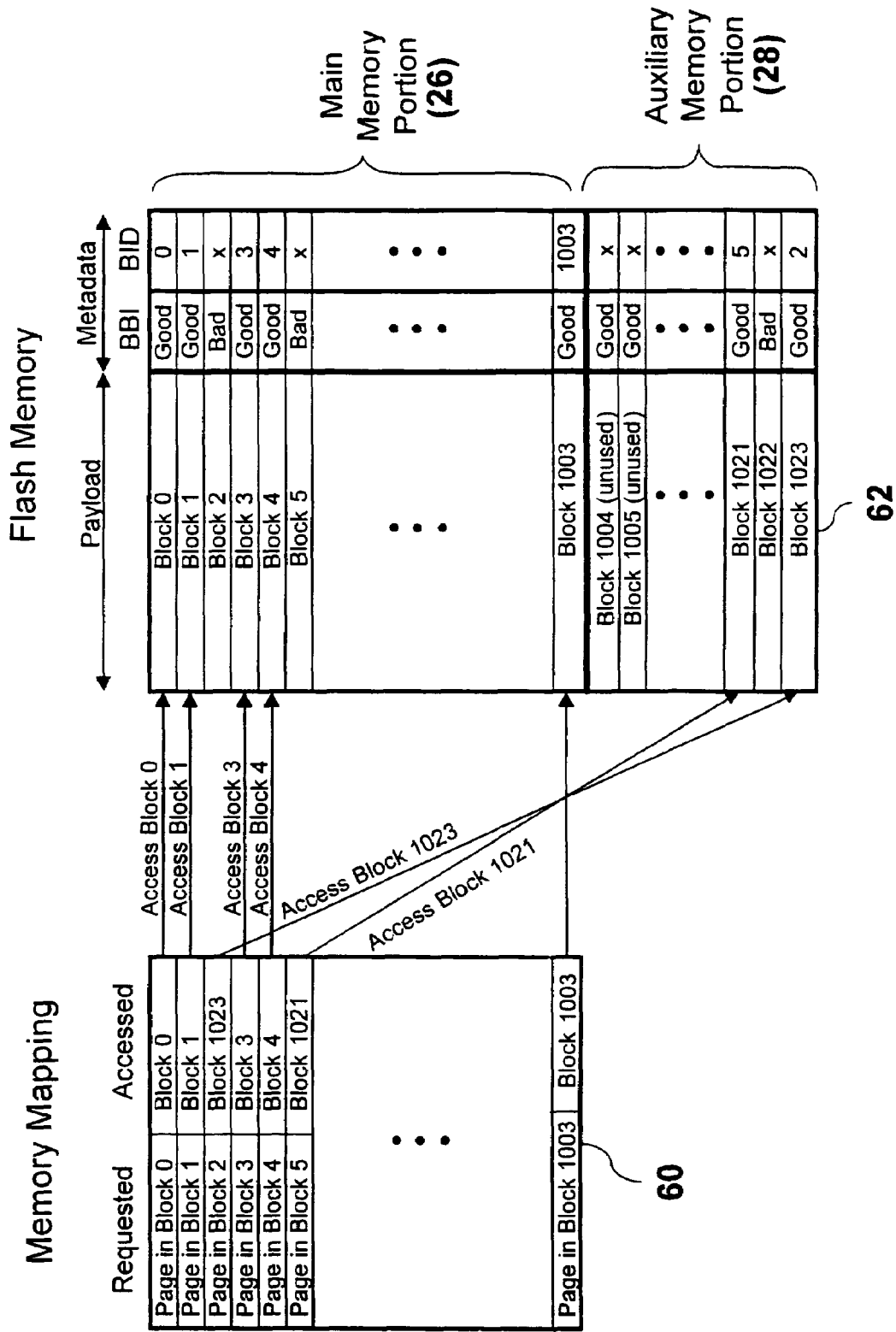
FIG. 7 is of a diagram illustrating memory mapping between blocks in the main portion of memory and the auxiliary portion of memory in accordance with an exemplary embodiment of the present invention.

FIG. 7 is of a diagram illustrating memory mapping between blocks in the main portion of memory 26 and the auxiliary portion of memory 28 in accordance with an exemplary embodiment of the present invention. The memory mapping matrix 60 represents the mapping between requested blocks and accessed blocks. When access to a page in flash memory is requested, the memory controller (e.g., memory controller 12) determines if the block in which the requested page is located good or bad. This determination is accomplished in accordance with the value of the BBI in page zero of that block. If the block is good, the requested page is accessed. If the block is bad, a corresponding page in the auxiliary portion of the memory is accessed in accordance with the value of the BID of page zero of that corresponding block. For example, as shown in the first row of matrix 60, a requesting device requests access to a page located in block 0 of the NAND flash memory device 20. The memory controller checks the BBI portion of page 0 of block 0. As shown in the matrix 62, the value of the BBI in the metadata portion of page 0 of block 0 indicates that block 0 is good. Thus, as indicated by the contents of the BID in page 0 of block 0, block 0 is accessed to access the requested page. The next row in the matrix 60 indicates that access to a page in block 1 is requested. The memory controller checks the BBI value from page 0 of block 1. As shown in the matrix 62, block 1 is good. Accordingly, block 1 is accessed to access the requested page.

Now let's see what happens when a bad block is encountered. The third row in the matrix 60 indicates that access to a page in block 2 is requested. As shown in the matrix 62, the BBI of the $0^{th}$ page of block 2 indicates that block 2 is bad. The value in the BID of page 0 of block 2 is indicated as a don't care because it does not matter what value is stored in the BID. Since block 2 is bad, its page 0 BID is not read to determine where to search in the auxiliary data, in part, because data read from a bad block may be suspect as being inaccurate. Because block 2 is bad, the memory controller starts searching for the block in the auxiliary memory portion 28 that corresponds to block 2. Page 0 of each block in the auxiliary memory portion 28 is checked to determine if its BID value matches the value of the bad block. Thus, in this example, the memory controller searches the auxiliary memory portion 28 until a block is found having a BID value of 2 in its metadata portion of page 0. As shown in the matrix 62, block 1023 is the designate block that corresponds to bad block 2. As depicted in the matrix 60, requests to access pages in blocks 3 and 4 result in blocks 3 and 4 being accessed because blocks 3 and for are good. The next row in the matrix 60 indicates that access to a page in block 5 is requested. As shown in the matrix 62, block 5 is bad as indicated by the BBI value in the metadata portion of page 0 of block 5. The memory controller searches the auxiliary memory portion 28 until a designated block corresponding to bad block 5 is found. As shown in the matrix 62, block 1021 corresponds to bad block 5. This is indicated by the BID value of 5 stored in the metadata portion of page 0 of block 1021.

Figure 8:
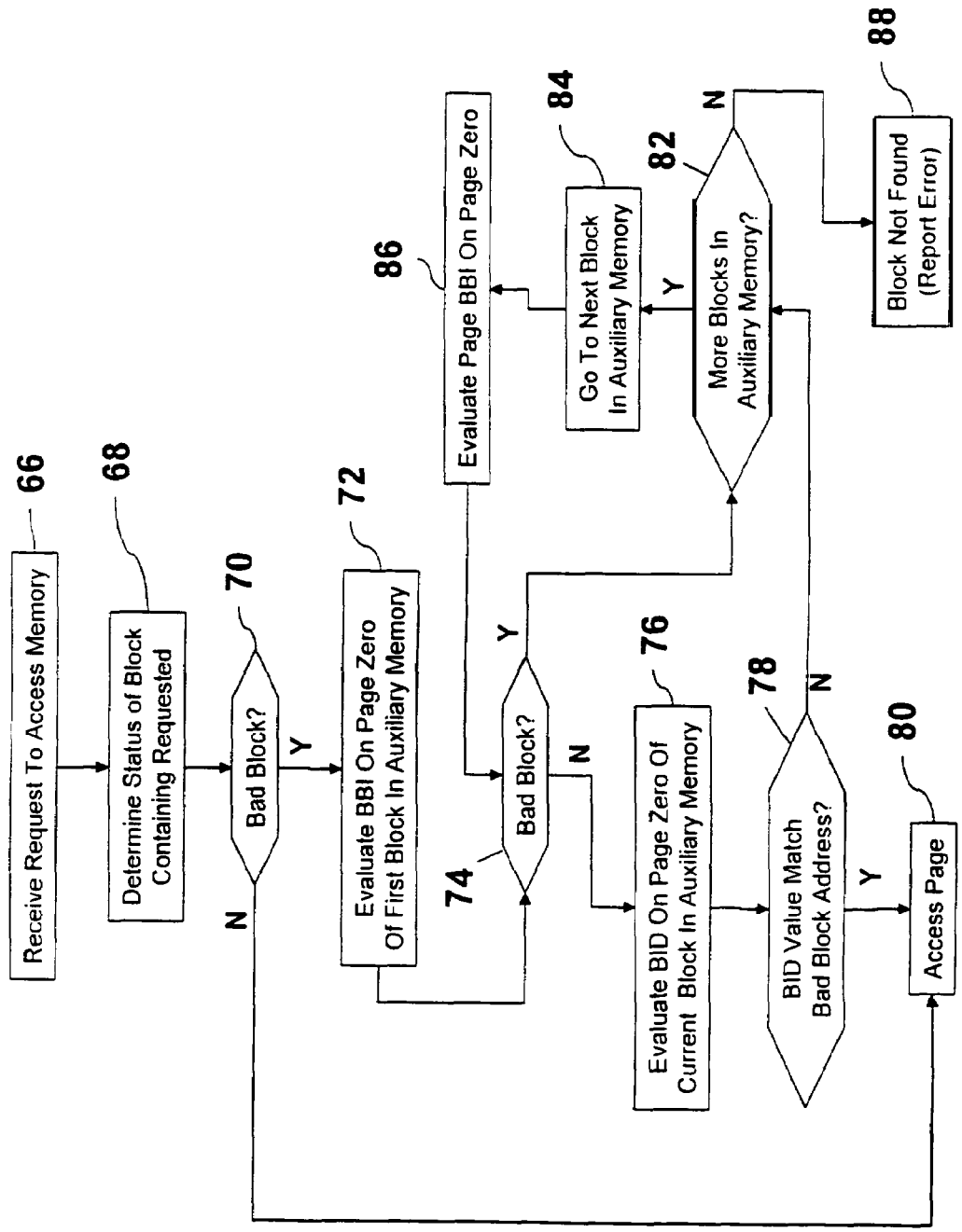
FIG. 8 is a flow diagram of a process for accessing a page of NAND flash memory in accordance with an exemplary of the present invention.

FIG. 8 is a flow diagram of a process for accessing a page of NAND flash memory in accordance with an exemplary of the present invention. A request to access the NAND flash memory is received at step 66. This request can be a request to read from or write to the NAND flash memory. The request includes an address to be accessed. The requested address includes a page address. The status of the block containing the requested page is determined at step 68. In an exemplary embodiment of the present invention, the status is determined by evaluating the BBI from metadata in page zero of the block in which the request page is located. At step 70, it is determined (e.g., by the memory controller) if the block is bad in accordance with the evaluated BBI. The BBI can indicate the status of a block by any appropriate means, such as setting a bit or plurality of bits, for example. If the block is not bad (good), the requested page is accessed at step 80.

Accessing the requested page can comprise reading contents from the payload portion of the page, reading contents from the metadata portion of the page, writing to the payload portion of the page, writing to the metadata portion of the page, or a combination thereof. If accessing a page comprises writing a page, the BID of that page is evaluated to determine if the page is allocated or unallocated as described above. If the page is allocated, the block containing that page is erased before the write can proceed.

If, at step 70, it is determined that the block is bad, the first block of the auxiliary memory is accessed at step 72. The first block of the auxiliary memory can comprise any appropriate block, and blocks can be searched in any appropriate manner. In accordance with an exemplary embodiment of the present invention, the block having the highest address is accessed first and blocks are searched by decremented an address counter (step 84), for example. Alternatively, the first block searched can be the block having the lowest address in the auxiliary memory, and the address counter can be incremented (step 84), for example. Other types of search routines are envisioned. At step 72, the BBI on page zero of the first block in auxiliary memory is evaluated to determine if that block is good or bad (step 74). If the block is bad, it is determined if more block are available in the auxiliary memory portion (step 82). If no more blocks are available, the process completes at step 88. Optionally, an error message can be provided. If more blocks are available in the auxiliary memory portion, (step 82), the search continues to the next block in the auxiliary memory at step 84. The BBI from the next block is evaluated (step 86) to determine if it is bad (step 74). If this block is bad, the process proceeds as described above.

If, at step 74, it is determined that the block is good, the BID stored in the metadata portion of page zero of the current block in auxiliary memory is evaluated (step 76) to determine if it matches the value of the bad block from the main memory portion. If the BID matches (step 78), the corresponding page from the current block is accessed (step 80). If the BID does not match the address value of the bad block (step 78), it is determined if more blocks are available in the auxiliary memory (step 82), and the process proceeds as previously described.

Figure 9:
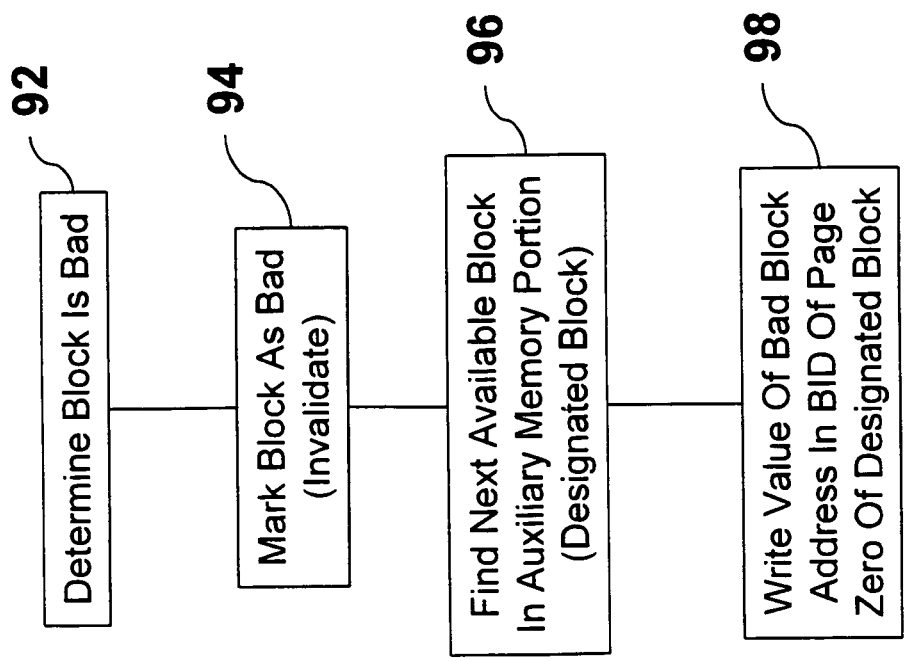
FIG. 9 is a flow diagram of a process for invalidating a block in accordance with an exemplary embodiment of the present invention.

A block of NAND flash memory can be bad when it is delivered by the supplier. It is envisioned that shipped bad blocks will be marked as bad by the supplier/manufacturer. A block of NAND flash memory also can become bad when it reaches its write/erase endurance level. In accordance with an exemplary embodiment of the present invention, bad blocks, if not previously marked bad, are invalidated in accordance with the process depicted in FIG. 9. A block is determined to be bad at step 92. This can be accomplished in any appropriate manner. For example, some NAND flash memories have error detection and correction codes contained in the metadata portion of memory. These error detection and correction codes can be used to determine if a block is bad. A bad block is marked as bad (invalidated) at step 94. A block can be marked as bad in any appropriate manner. For example, a block can be marked as bad by writing all logic zeros (0s) in the BBI of page zero of the block. The auxiliary memory portion of the NAND flash memory is searched for the next available block at step 96. This search can be conducted in any appropriate manner, such as described above, for example. The next available block, also referred to as the designated block, is marked as the designated block by writing the address of the bad block in the BID of page zero of the designated block. Thus the designated block corresponds to the bad block.

Figure 10:
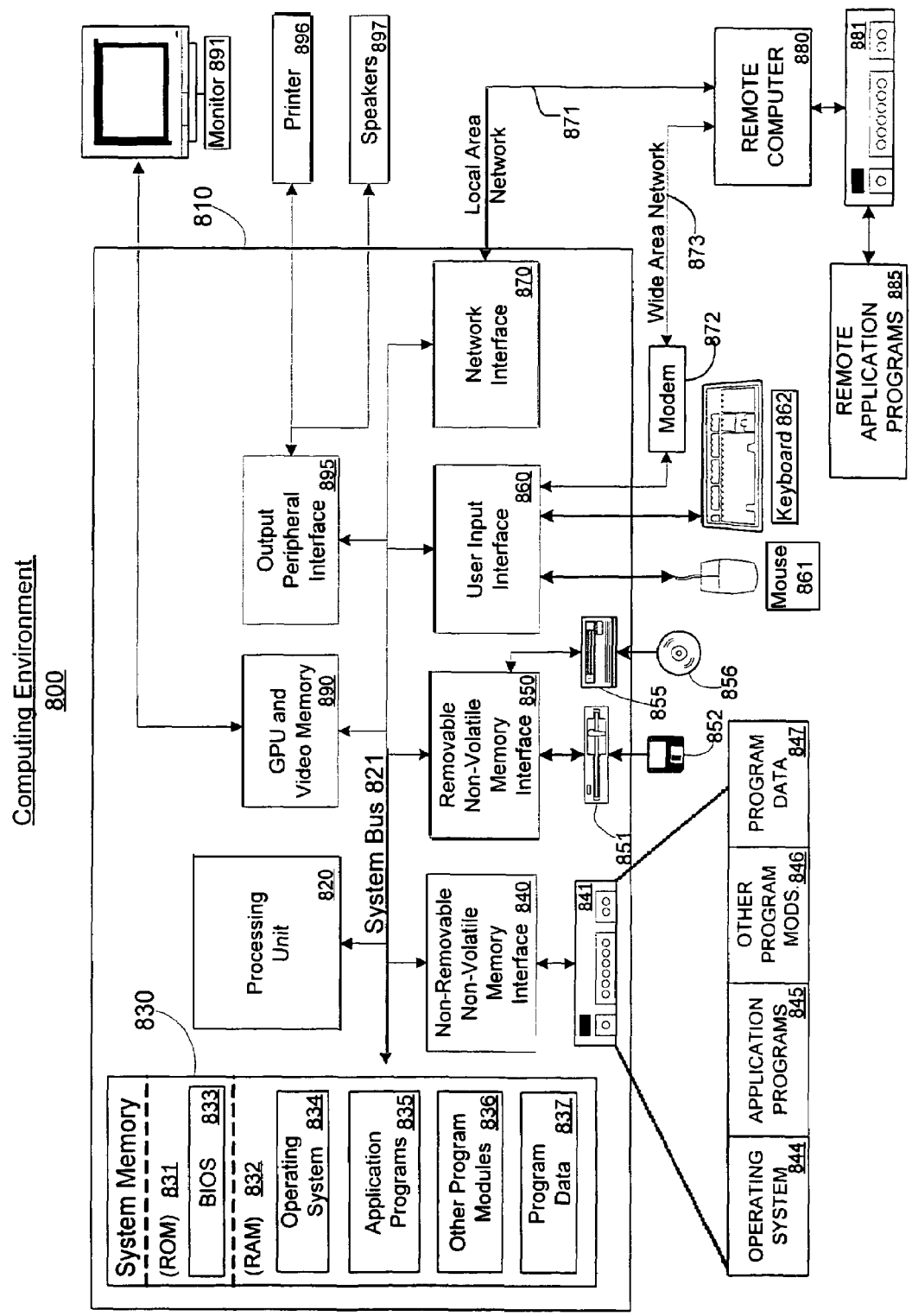
FIG. 10 illustrates an example of a suitable computing system environment in which an exemplary embodiment of the present invention can be implemented.

Although the description of the present invention has been in the context of an exemplary NAND flash memory management system, it is also applicable to more generic computing environments wherein memory can be managed. FIG. 10 illustrates an example of a suitable computing system environment 800 in which an exemplary embodiment of the present invention can be implemented. The computing system environment 800 is only one example of a suitable computing environment and is not intended to suggest any limitation as to the scope of use or functionality of the invention. Neither should the computing environment 800 be interpreted as having any dependency or requirement relating to any one or combination of components illustrated in the exemplary operating environment 800.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network or other data transmission medium. In a distributed computing environment, program modules and other data may be located in both local and remote computer storage media including memory storage devices.

With reference to FIG. 10, an exemplary system for implementing the invention includes a general purpose computing device in the form of a computer 810. Components of computer 810 may include, but are not limited to, a processing unit 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 810 typically includes a variety of computer readable media. Computer readable media can be any available media that can be accessed by computer 810 and includes both volatile and non-volatile media, removable and non-removable media. By way of example, and not limitation, computer readable media may comprise computer storage media and communication media. Computer storage media includes both volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 810. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 830 includes computer storage media in the form of volatile and/or non-volatile memory such as ROM 831 and RAM 832. A basic input/output system 833 (BIOS), containing the basic routines that help to transfer information between elements within computer 810, such as during start-up, is typically stored in ROM 831. RAM 832 typically contains data and/or program modules that are immediately accessible to and/or presently being operated on by processing unit 820. By way of example, and not limitation, FIG. 10 illustrates operating system 834, application programs 835, other program modules 836, and program data 837.

The computer 810 may also include other removable/non-removable, volatile/non-volatile computer storage media. By way of example only, FIG. 10 illustrates a hard disk drive 841 that reads from or writes to non-removable, non-volatile magnetic media, a magnetic disk drive 851 that reads from or writes to a removable, non-volatile magnetic disk 852, and an optical disk drive 855 that reads from or writes to a removable, non-volatile optical disk 856, such as a CD-ROM or other optical media. Other removable/non-removable, volatile/non-volatile computer storage media that can be used in the exemplary operating environment include, but are not limited to, magnetic tape cassettes, flash memory cards, digital versatile disks, digital video tape, solid state RAM, solid state ROM, and the like. The hard disk drive 841 is typically connected to the system bus 821 through a non-removable memory interface such as interface 840, and magnetic disk drive 851 and optical disk drive 855 are typically connected to the system bus 821 by a removable memory interface, such as interface 850.

The drives and their associated computer storage media provide storage of computer readable instructions, data structures, program modules and other data for the computer 810. In FIG. 10, for example, hard disk drive 841 is illustrated as storing operating system 844, application programs 845, other program modules 846, and program data 847. Note that these components can either be the same as or different from operating system 834, application programs 835, other program modules 836, and program data 837. Operating system 844, application programs 845, other program modules 846, and program data 847 are given different numbers here to illustrate that, at a minimum, they are different copies.

A user may enter commands and information into the computer 810 through input devices such as a keyboard 862 and pointing device 861, commonly referred to as a mouse, trackball or touch pad. Other input devices (not shown) may include a microphone, joystick, game pad, satellite dish, scanner, or the like. These and other input devices are often connected to the processing unit 820 through a user input interface 860 that is coupled to the system bus, but may be connected by other interface and bus structures, such as a parallel port, game port or a universal serial bus (USB). A monitor 891 or other type of display device is also connected to the system bus 821 via an interface, such as a video interface, which may comprise a graphics processing unit (GPU) and video memory 890. In addition to the monitor, computers may also include other peripheral output devices such as speakers 897 and printer 896, which may be connected through an output peripheral interface 895.

The computer 810 may operate in a networked environment using logical connections to one or more remote computers, such as a remote computer 880. The remote computer 880 may be a personal computer, a server, a router, a network PC, a peer device or other common network node, and typically includes many or all of the elements described above relative to the computer 810, although only a memory storage device 881 has been illustrated in FIG. 10. The logical connections depicted include a LAN 871 and a WAN 873, but may also include other networks. Such networking environments are commonplace in offices, enterprise-wide computer networks, intranets and the internet.

When used in a LAN networking environment, the computer 810 is connected to the LAN 871 through a network interface or adapter 870. When used in a WAN networking environment, the computer 810 typically includes a modem 872 or other means for establishing communications over the WAN 873, such as the internet. The modem 872, which may be internal or external, may be connected to the system bus 821 via the user input interface 860, or other appropriate mechanism. In a networked environment, program modules depicted relative to the computer 810, or portions thereof, may be stored in the remote memory storage device. By way of example, and not limitation, FIG. 10 illustrates remote application programs 885 as residing on memory device 881. It will be appreciated that the network connections shown are exemplary and other means of establishing a communications link between the computers may be used.

As mentioned above, while exemplary embodiments of the present invention have been described in connection with various computing devices, the underlying concepts may be applied to any computing device or system capable of managing memory.

The various techniques described herein may be implemented in connection with hardware or software or, where appropriate, with a combination of both. Thus, the methods and apparatus of the present invention, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. In the case of program code execution on programmable computers, the computing device will generally include a processor, a storage medium readable by the processor (including volatile and non-volatile memory and/ or storage elements), at least one input device, and at least one output device. The program(s) can be implemented in assembly or machine language, if desired. In any case, the language may be a compiled or interpreted language, and combined with hardware implementations.

The methods and apparatus of the present invention may also be practiced via communications embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, or the like, the machine becomes an apparatus for practicing the invention. When implemented on a general-purpose processor, the program code combines with the processor to provide a unique apparatus that operates to invoke the functionality of the present invention. Additionally, any storage techniques used in connection with the present invention may invariably be a combination of hardware and software.

While the present invention has been described in connection with the preferred embodiments of the various figures, it is to be understood that other similar embodiments may be used or modifications and additions may be made to the described embodiments for performing the same function of the present invention without deviating therefrom. Therefore, the present invention should not be limited to any single embodiment, but rather should be construed in breadth and scope in accordance with the appended claims.

What is claimed:

1. A method for accessing memory in a memory device, said method comprising:
    configuring said memory device to comprise a main memory portion and an auxiliary memory portion, wherein:
        each of said main memory portion and said auxiliary memory portion comprises a plurality of blocks of memory;
        each block comprises a plurality of pages of memory; and
        at least one page of each block comprises a status indicator stored therein indicative of a status of a block within which said at least one page is located;
    receiving a request to access a page located in said main memory portion;
    selecting a block from said main memory portion in which said requested page is located;
    determining a status of said selected block to be one of good and bad in accordance with a status indicator stored within a predetermined page of said selected block;
    for a determined status of good, providing access to said requested page located in said selected block in said main memory portion;
    for a determined status of bad, providing access to a corresponding page located in a designated block of said auxiliary memory portion in accordance with an address identifier stored within said predetermined page of said designated block, said address identifier being indicative of an address of said bad block.

2. A method in accordance claim 1, further comprising:
    comparing an address identifier from said predetermined page of each block of said auxiliary memory portion to said address of said bad block until said designated block is found.

3. A method in accordance with claim 1, further comprising:
    determining a status of a current page to be one of allocated and unallocated in accordance with a value of an address identifier of said current page.

4. A method in accordance with claim 1, wherein:
    an address identifier comprising all binary 1s is indicative of an unallocated page; and
    an address identifier comprising other than all binary 1s is indicative of an allocated page.

5. A method in accordance with claim 1, further comprising storing a value of an address of a bad block located in said main memory portion in an address identifier of a designated block located in said auxiliary memory portion.

6. A method in accordance with claim 1, wherein said memory device comprises a NAND flash memory device.

7. A method in accordance with claim 1, wherein said predetermined page comprises a 0th page of a block.

8. A memory controller comprising:
    a first input/output portion coupleable to a memory device;
    a second input/output portion coupleable to an interfacing means; and
    a memory management processor coupled to said first input/output portion and said second input/output portions, wherein upon receiving a request via said first input/output portion to access a page of memory of said memory device, said memory management processor:
        selects a block from a main memory portion of said memory device in which said requested page is located;
        determines a status of said selected block to be one of good and bad in accordance with a status indicator stored within a predetermined page of said selected block;
        for a determined status of good, provides access to said requested page located in said selected block in said main memory portion;
        for a determined status of bad, provides access to a corresponding page located in a designated block of an auxiliary memory portion in accordance with an address identifier stored within said predetermined page of said designated block said address identifier being indicative of an address of said bad block.

9. A controller in accordance with claim 8, wherein:
    said memory management processor compares an address identifier from said predetermined page of each block of said auxiliary memory portion to said address of said bad block until said designated block is found.

10. A controller in accordance with claim 8, wherein:
    said memory management processor determines a status of a current page to be one of allocated and unallocated in accordance with an address identifier of said current page.

11. A controller in accordance with claim 10, wherein:
    an address identifier comprising all binary 1s is indicative of an unallocated page; and
    an address identifier comprising other than all binary 1s is indicative of an allocated page.

12. A controller in accordance with claim 10, wherein said memory management processor stores a value of an address of a bad block located in said main memory portion in an address identifier of a designated block located in said auxiliary memory portion.

13. A controller in accordance with claim 8, wherein said memory device comprises a NAND flash memory device.

14. A controller in accordance with claim 8, wherein said predetermined page comprises a 0th page of a block.

15. A computer readable storage medium having stored thereon a data structure, said data structure comprising:
- a main memory portion comprising a plurality of blocks of memory; and
- an auxiliary memory portion comprising a plurality of blocks of memory, wherein:
  - each block of memory comprises a plurality of pages of memory;
  - at least one page of each block of memory comprises:
    - a payload portion for comprising payload data; and
    - a metadata portion for comprising metadata, said metadata portion comprising:
      - a first portion for comprising a value indicative of a status of a block within which said at least one page is located;
      - a second portion for comprising a value indicative of one of:
        - an address of a designated block located in said auxiliary memory portion; and
        - a status of a respective page.

16. A data structure in accordance with claim 15, wherein a status of a page comprises one of allocated and unallocated.

17. A data structure in accordance with claim 15, wherein a status of a block comprises one of good and bad.

18. A data structure in accordance with claim 15, wherein:
- a first portion comprising all binary 1s is indicative of an unallocated page; and
- a first portion comprising other than all binary 1s is indicative of an allocated page.

19. A data structure in accordance with claim 15, wherein a predetermined page of each block comprises a value indicative of a status of a block.

20. A computer readable medium in accordance with claim 15, wherein said computer readable medium comprises a NAND flash memory device.

* * * * *

UNITED STATES PATENT AND TRADEMARK OFFICE
CERTIFICATE OF CORRECTION

| | | |
|---|---|---|
| PATENT NO. | : 7,366,825 B2 | Page 1 of 1 |
| APPLICATION NO. | : 11/115004 | |
| DATED | : April 29, 2008 | |
| INVENTOR(S) | : Gregory G. Williams et al. | |

It is certified that error appears in the above-identified patent and that said Letters Patent is hereby corrected as shown below:

In column 12, line 7, in Claim 4, delete "is is" and insert -- 1s is --, therefor.

In column 12, line 9, in Claim 4, delete "is is" and insert -- 1s is --, therefor.

Signed and Sealed this
Twelfth Day of April, 2011

David J. Kappos
*Director of the United States Patent and Trademark Office*